(12) United States Patent
Musselman et al.

(10) Patent No.: US 6,832,185 B1
(45) Date of Patent: Dec. 14, 2004

(54) NON-SYNCHRONOUS HARDWARE EMULATOR

(75) Inventors: Roy Glenn Musselman, Rochester, MN (US); Jeffrey Joseph Ruedinger, Rochester, MN (US)

(73) Assignee: Quickturn Design Systems, Inc., San Jose, CA (US)

( * ) Notice: Subject to any disclaimer, the term of this patent is extended or adjusted under 35 U.S.C. 154(b) by 0 days.

(21) Appl. No.: 09/522,354

(22) Filed: Mar. 9, 2000

(51) Int. Cl.$^7$ .............................................. G06F 9/455
(52) U.S. Cl. ....................................................... 703/23
(58) Field of Search ........................................... 703/23

(56) References Cited

U.S. PATENT DOCUMENTS

| | | | | |
|---|---|---|---|---|
| 5,551,013 A | * | 8/1996 | Beausoleil et al. | 703/23 |
| 5,742,180 A | * | 4/1998 | DeHon et al. | 326/40 |
| 6,141,636 A | * | 10/2000 | Sarno et al. | 703/23 |

OTHER PUBLICATIONS

Trimberger, Steve, "Scheduling Designs into a Time–Multiplexed FPGA", FPGA 1998, pp. 153–160.*
U.S. Appl. No. 09/052,732, filed Mar. 31, 1998, William F. Beausoleil, et al., "Tightly Coupled Emulation Processors".
IBM Corporation, "Technique to Synchronize an Emulator or Simulation Accelerator to Multiple, Asynchronous Target Systems", IBM Technical Disclosure Bulletin, vol. 39, No. 10 (Oct., 1996), pp. 117–120.
Cadence Design Systems, Inc., "Emulation" and "CoBALT" (Various unnumbered pages published on the World Wide Web, undated, copyright 1999).

* cited by examiner

*Primary Examiner*—Kevin J. Teska
*Assistant Examiner*—Dwin M. Craig
(74) *Attorney, Agent, or Firm*—Orrick Herrington & Sutcliffe LLP

(57) ABSTRACT

A hardware emulator chip contains an array of cells and a programmable interconnection array. Each cell performs only a single logic function, which is configurable. The chips run asynchronously to one another, and within each chip cells are enabled by a sequential wave signal, which enables successive logical rows of cells. Within the chip, it is possible to connect any arbitrary cell output to any arbitrary cell input. Preferably, a set of off-chip connections is made possible by time-multiplexing the output of each subset to the wave signal. In one embodiment, full interconnection of cells within a chip is provided by providing a time-multiplexed programmable array of interconnect switches, the setting of each switch changing with each successive wave. In a second embodiment, full interconnection of cells within a chip is provided by providing a programmable array of interconnect switches. The hardware emulator described herein may thus be viewed as a hybrid of the FPGA type emulator and the time-multiplexed processor array emulator.

16 Claims, 17 Drawing Sheets

NON-SYNCHRONOUS HARDWARE EMULATOR

FIELD OF THE INVENTION

The present invention relates to digital data processing, and in particular to hardware emulators used in the development of digital data processing devices.

BACKGROUND OF THE INVENTION

The programmable digital processor, which executes instructions of a stored program in a digital device, has become a ubiquitous instrument. A modern computer system typically comprises one or more central processing units (CPU) which execute the instructions of an operating system and user application software. It usually also includes numerous auxiliary processors which perform special functions, such as control of input/output channels, control of data storage devices, control of keyboards or other input devices, control of displays, etc. Although usually associated with computers, programmable processors are increasingly found in medical instruments, kitchen appliances, automobiles, cell phones, manufacturing apparatus, and a variety of other devices. Indeed, as prices have declined and capabilities have increased, there seems to be no end to the uses to which processors are being put.

Although small, a modem programmable processor is a device of enormous complexity. A processor typically contains data registers, special registers, arithmetic/logic units, instruction decoder and sequencer, internal data buses, control logic, and I/O ports, and may also contain on-board cache for instructions or data, and various other elements. By cramming more and more such elements onto a single chip, the capability of a processor can be enhanced. With the demands of the marketplace, there is a need for ever faster and more powerful processors. This, of course, increases the complexity of the devices and places greater demand on the developers of processor hardware.

Because the design and development of a processor is a task of great complexity, developers have long used computers and similar digital devices in the development of processors. In particular, one of the design tools used for the development of processors and other complex digital logic devices is the hardware emulator.

A hardware emulator is a device which mimics the behavior of a processor, a component of a processor, or other digital logic based on a detailed design specification, without the actual physical processor being built. I.e., a detailed design specification of a processor is used as a blueprint for configuring a special-purpose emulation device, which then acts exactly as the processor would. I.e., the configured emulator responds to inputs in exactly the way the proposed processor would. Because the emulator is in fact a special-purpose device configured to act like the processor, rather than a finished processor, it can't match the speed of a real processor, nor will it necessarily be able to detect all design problems. However, it is a very useful tool in digital logic design, and is often used to verify the functional correctness of a complex design before constructing an actual device.

One type of known hardware emulator is based on an array of large field programmable gate arrays (FPGA). The FPGA emulator typically contains many logic gates with a large set of configurable interconnections. The system is configured to emulate a logic network by specifying the interconnections between programmable cells. While this system works well for small logic networks, it does not scale particularly well. The number of interconnections required to provide full interconnection of any arbitrary gate with any other gate grows as the square of the number of gates. Most large FPGA systems therefore do not provide full interconnections, i.e., there are only a limited number of inputs to each cell, and it is not always possible to route an output of one cell directly to an input of another cell.

An alternative type of hardware emulator is a time-multiplexed array of emulation processor cells. In the time-multiplexed design, each cell is in fact a small processor which executes a control program to emulate a different logic function at each respective clock cycle. All cells run off a single synchronous system clock. Thus, the time-multiplexed processor array requires some integral number of clock cycles, N, for its cells to cover all the logic functions of the design. Each cell in the time-multiplexed system is reused each clock cycle to perform the function that would require at least N cells in the FPGA array.

Naturally, the time-multiplexed processor array emulator is much slower than an FPGA array covering an equivalent number of logic functions. The speed of the time-multiplexed emulator is a major drawback to its use. However, it is difficult to construct FPGA emulators sufficiently large to emulate complex logic designs. Not only does the FPGA require at least one cell for each emulated logic function, but because there are only a limited number of interconnections, it is not generally possible to use all the cells in an FPGA. This problem grows with the complexity of the logic design, so that as the number of logic functions to emulate increases, the percentage of cells in an FPGA which can not be used also increases. Because the time-multiplexed processor array re-uses its cells and cell interconnections over and over again, it is more flexible and has the potential to emulate far more complex designs than the non-time-multiplexed FPGA emulator.

As digital logic designs increase in complexity, there is a need for improved emulators to support the development effort, which overcome the drawbacks of the existing art time-multiplexed processor array emulators and FPGA emulators.

SUMMARY OF THE INVENTION

A hardware emulator contains multiple emulation chips, each chip containing an array of cells, and a programmable interconnection array. Each cell performs only a single logic function, which is programmable to configure the emulator. The cells are enabled by a sequential wave signal, which enables successive subsets (logical rows) of cells. Within the chip, it is possible to connect any arbitrary cell output to any arbitrary cell input In the preferred embodiment, the chip contains an array of S×P cells arranged in S rows (subsets) of P cells each, each row being enabled by a separate wave of wave generation logic. A set of P output pairs (each containing a data line and a strobe line) corresponds to the P cells of each row. On the step enable pulse of row I, cell J may output using output pair J. In fact, there are two sets of P output pairs, one for use in communicating with other chips on the same circuit card, and the other for communicating with more remote chips. There are similarly two sets of P input pairs.

In the preferred embodiment, a set of off-chip connections is made possible by time-multiplexing the output of each subset to the wave signal. Thus it is possible to output an off-chip signal from or receive an off-chip signal into any cell in the chip, although the number of ports is related to the number of columns P, and not the number of rows S.

In a first preferred embodiment, full interconnection of cells within a chip is provided by providing a time-multiplexed programmable array of interconnect switches, the setting of each switch changing with each successive wave generated by the wave logic. The first embodiment greatly reduces the number of interconnection switches, but each switch is more complex and has the potential to slow down the emulator.

In a second preferred embodiment, fill interconnection of cells within a chip is provided by providing a programmable array of interconnect switches. The switches are programmed when the emulator is configured.

The hardware emulator described herein may thus be viewed as a hybrid of the FPGA type emulator and the time-multiplexed processor array emulator. Individual cells are very simple and operate very quickly, resembling in behavior the FPGA emulator cells. However, the interconnects behave more like the time-multiplexed array model, providing greater interconnection and the ability to emulate more complex designs than is typically possible with the FPGA emulator.

The details of the present invention, both as to its structure and operation, can best be understood in reference to the accompanying drawings, in which like reference numerals refer to like parts, and in which:

DETAILED DESCRIPTION OF THE PREFERRED EMBODIMENT

Figure 1A:
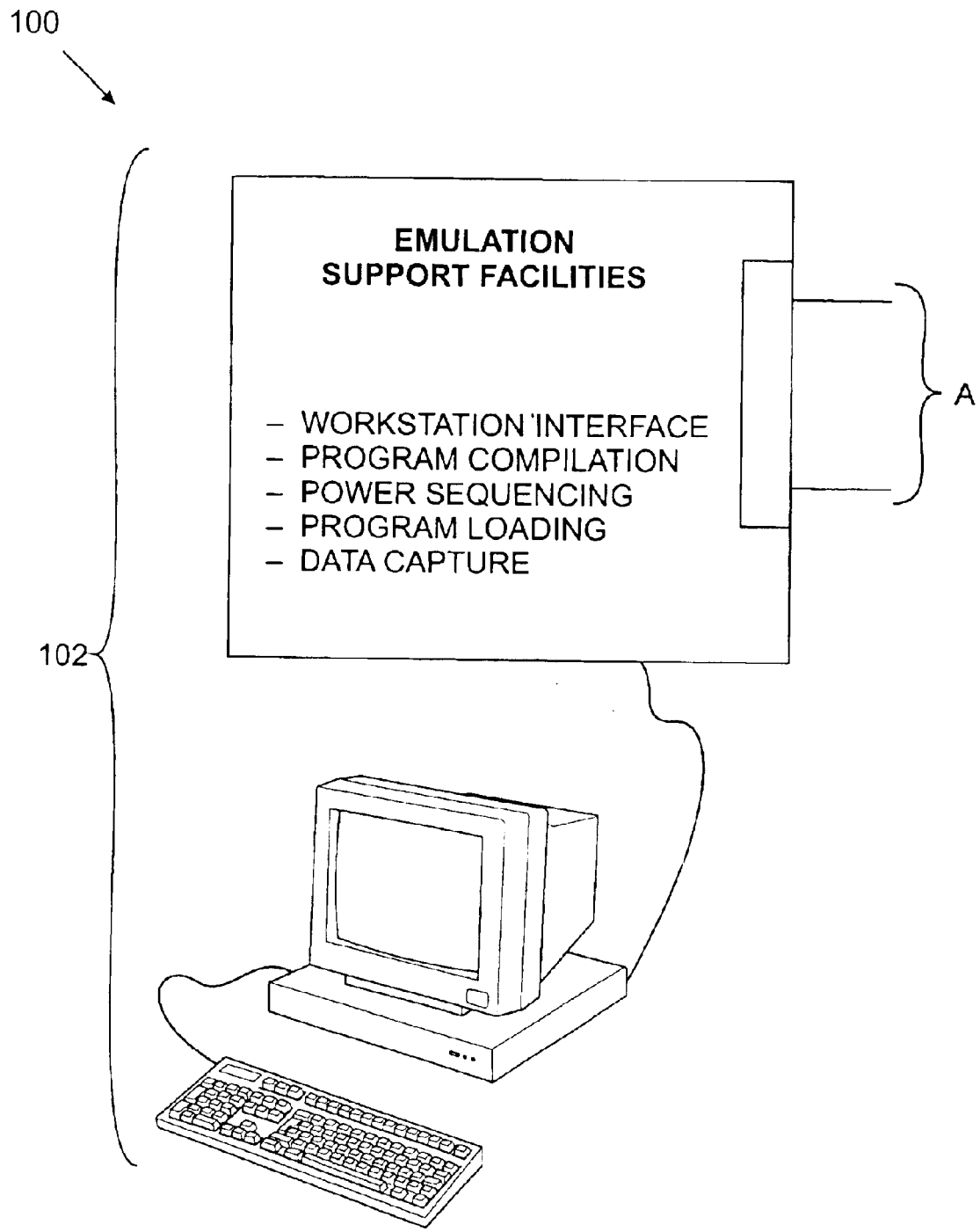
FIG. 1 is a high-level depiction of the the major hardware components of an emulation system, according to the preferred embodiment of the present invention.
Figure 1B:
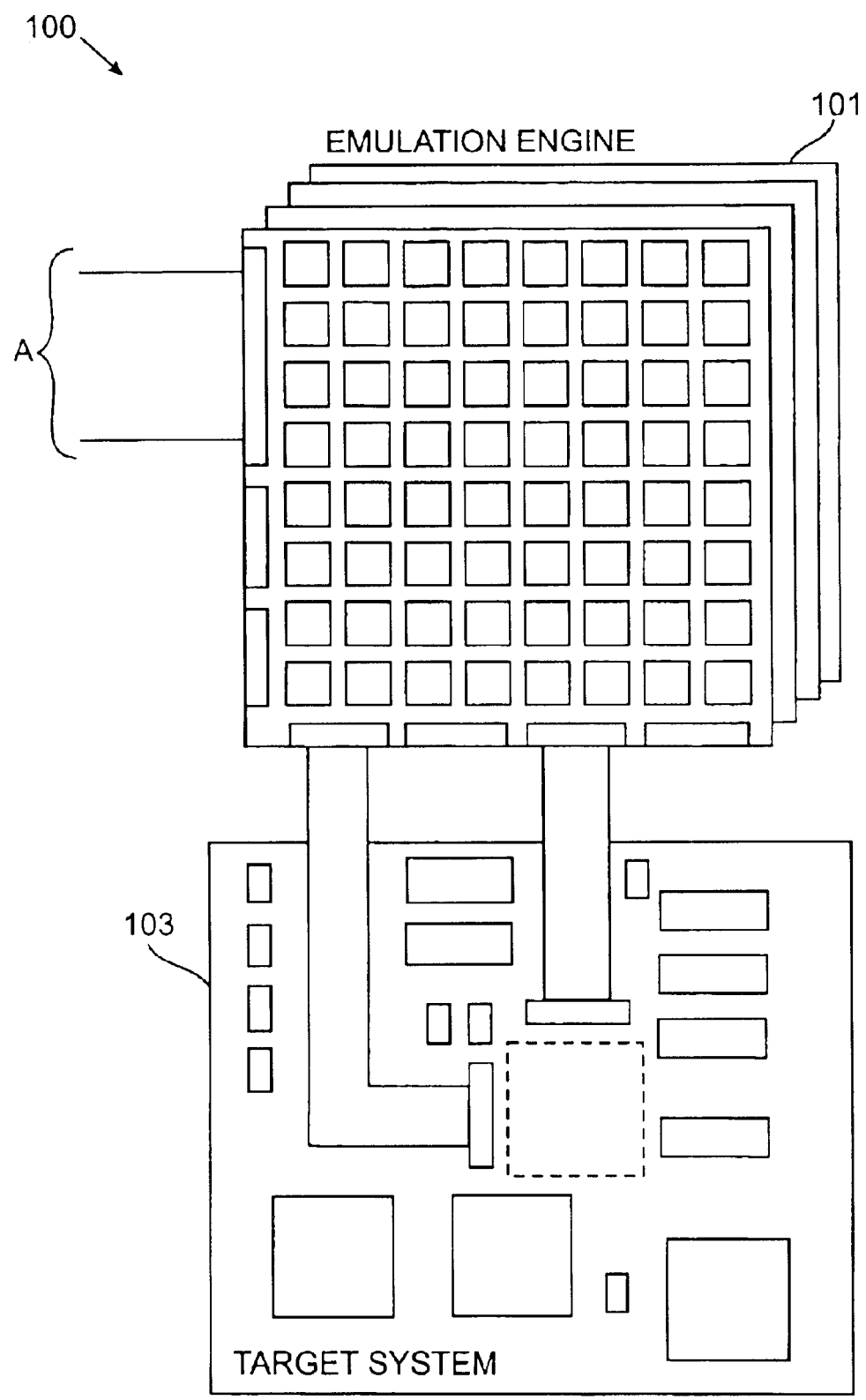
Figure 2A:
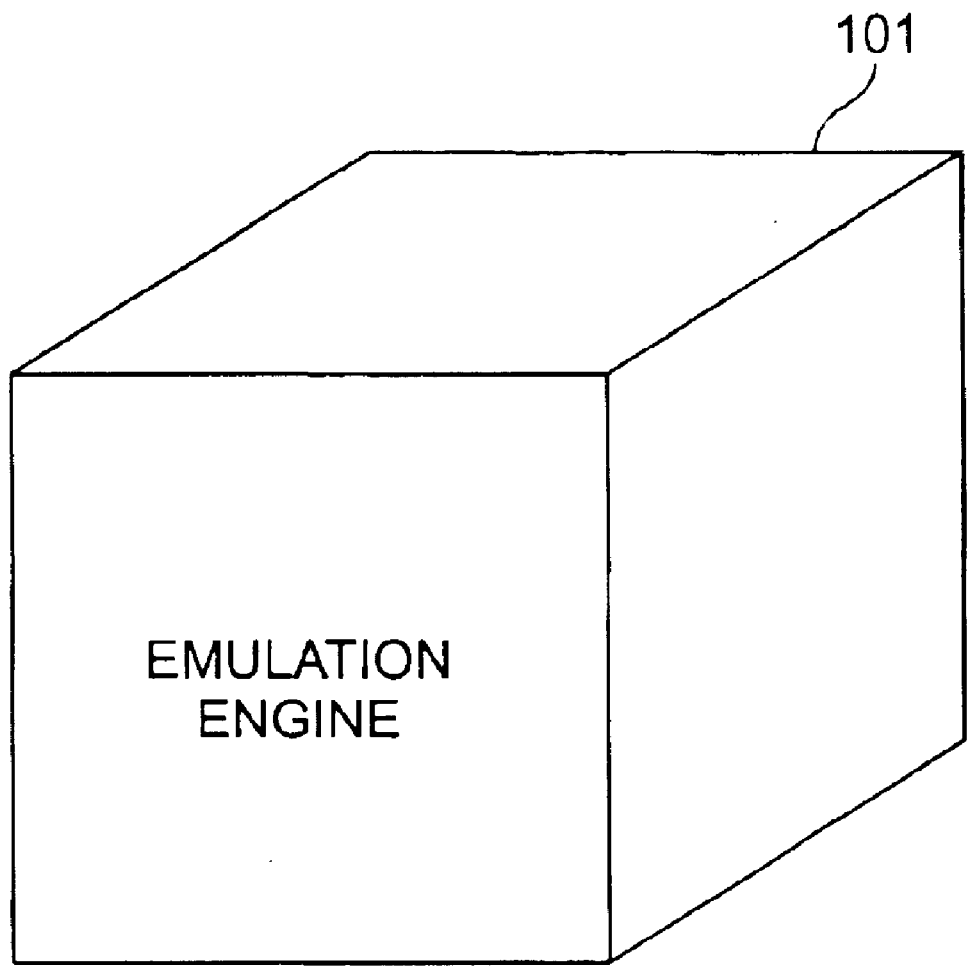
FIG. 2 illustrates at a high level how the emulation engine comprises boards, chip modules and cells, according to the preferred embodiment.
Figure 2B:
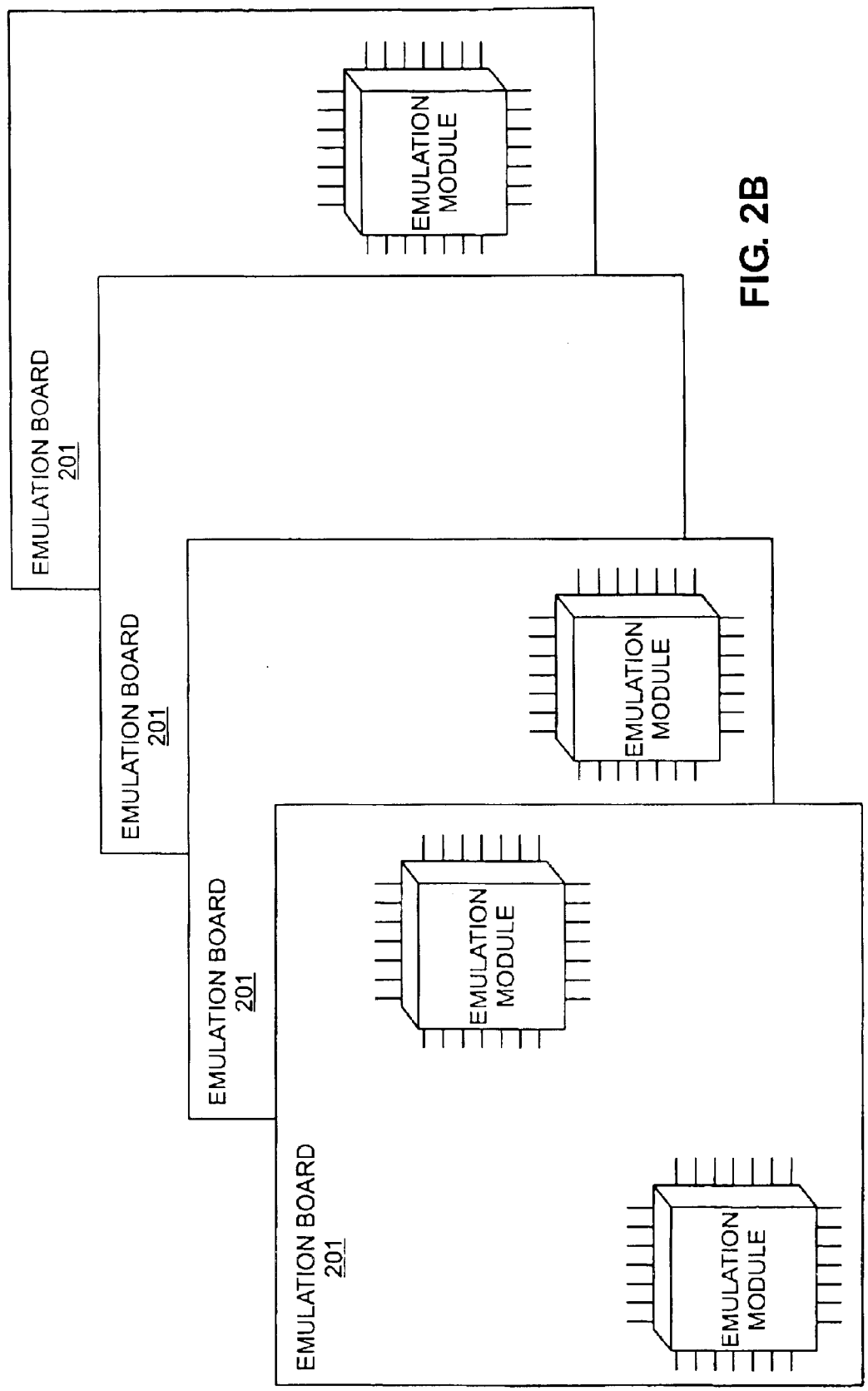
Figure 2C:
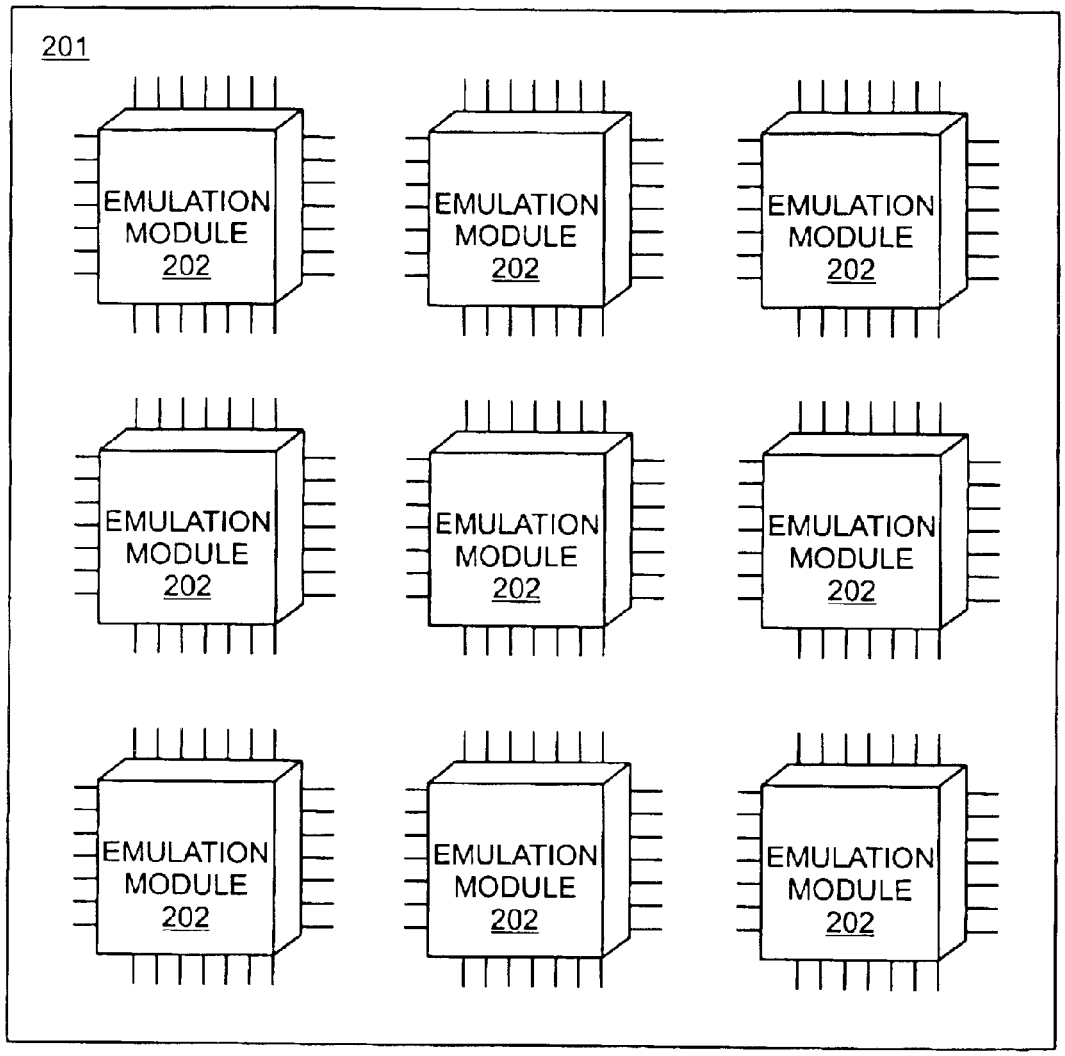
Figure 2D:
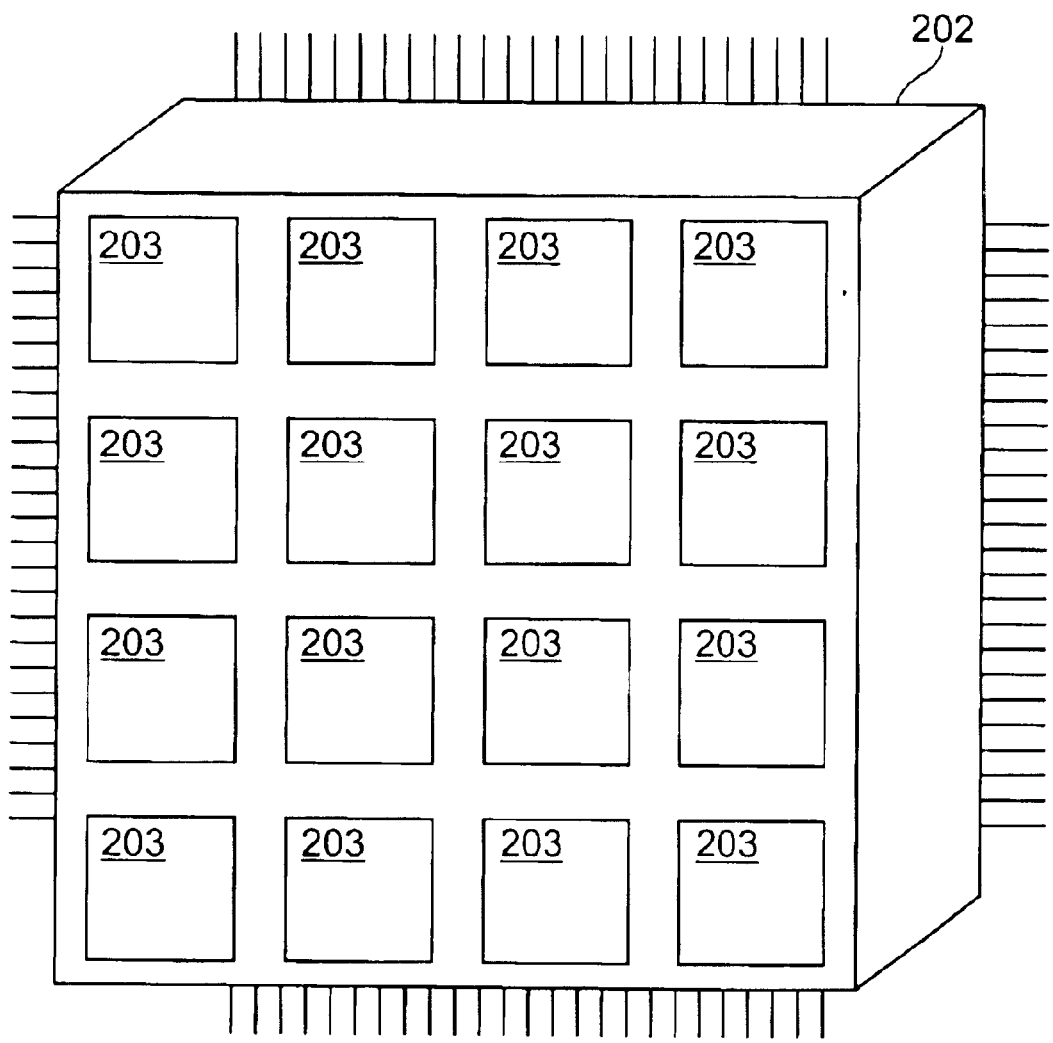

The major hardware components of an emulation system 100 for emulating a processor or other logic chip according to the preferred embodiment of the present invention are shown in FIG. 1. Emulation system 100 comprises a hardware emulation engine 101 which emulates the emulated devices (such as a processor), an emulation support facility 102, which is in fact a general purpose digital computer having special I/O ports for connecting to the emulation engine and software and data necessary for controlling the operation of the emulation engine 101, and target system 103 which is the environment in which the emulated device is intended to operate.

A target system 103 may be a complete system having finished hardware excepting only the emulated device, or may be only a subsystem or a portion of a system in which other devices are also emulated or I/O is emulated. Selected I/O pins of emulation engine I/O are connected to corresponding pins of target system 103, so that each I/O signal mimics an I/O signal of the intended device in the target system environment.

Support facility 102 provides several functions necessary for operation. It may be used to capture data from emulation engine 101 for purposes of monitoring. It is also used to configure emulation engine 101 to emulate a device, and to establish its initial state, by loading values into registers, latches or other or other constructs. Support facility 102 may contain a compiler for translating a design specification for a device into a configuration specification for the emulation engine, or the compiler may be located on a separate computer system.

Additional background concerning the operation of emulation systems is contained in U.S. Pat. No. 5,551,013 to Beausoleil, et al., which is herein incorporated by reference.

FIG. 2 illustrates at a high level how the emulation engine 101 comprises boards, chip modules and cells. The emulation engine is conceptually a very large array of cells, each of which performs a simple logic function, such as AND, OR, NOT, NAND, NOR, XOR, etc. Multiple cells 203 are packaged in a single chip (emulation module) 202. Multiple modules 202 are mounted on a single emulation board 201, which is a printed circuit card having interconnection wiring. An emulation engine typically contains multiple such boards 201. While a certain number of cells 203, modules 202 and boards 201 are shown in FIG. 2, it will be understood that these are illustrative only, and the actual number may vary. Furthermore, there are typically additional components on the boards and modules which are not shown in FIG. 2 for clarity of illustration.

Ideally, one would like to construct an emulation engine in which the output of any arbitrary cell could be used as input to any arbitrary cell. However, the number of required interconnections increases as the square of the number of cells. It will be appreciated that given the complex processor logic that is emulated, a very large number of cells is required, and the number of interconnects that would be needed for full cell interconnection is impractical. As a practical matter, there are a limited number of pins available on each chip, which severely limits the number of off-chip interconnections. There are further practical limits involving the number of wires that can be placed on a board, and the number of board-to-board interconnects. A module design should allow sufficient off-chip interconnections consistent with the limits of the packaging.

Figure 3A:
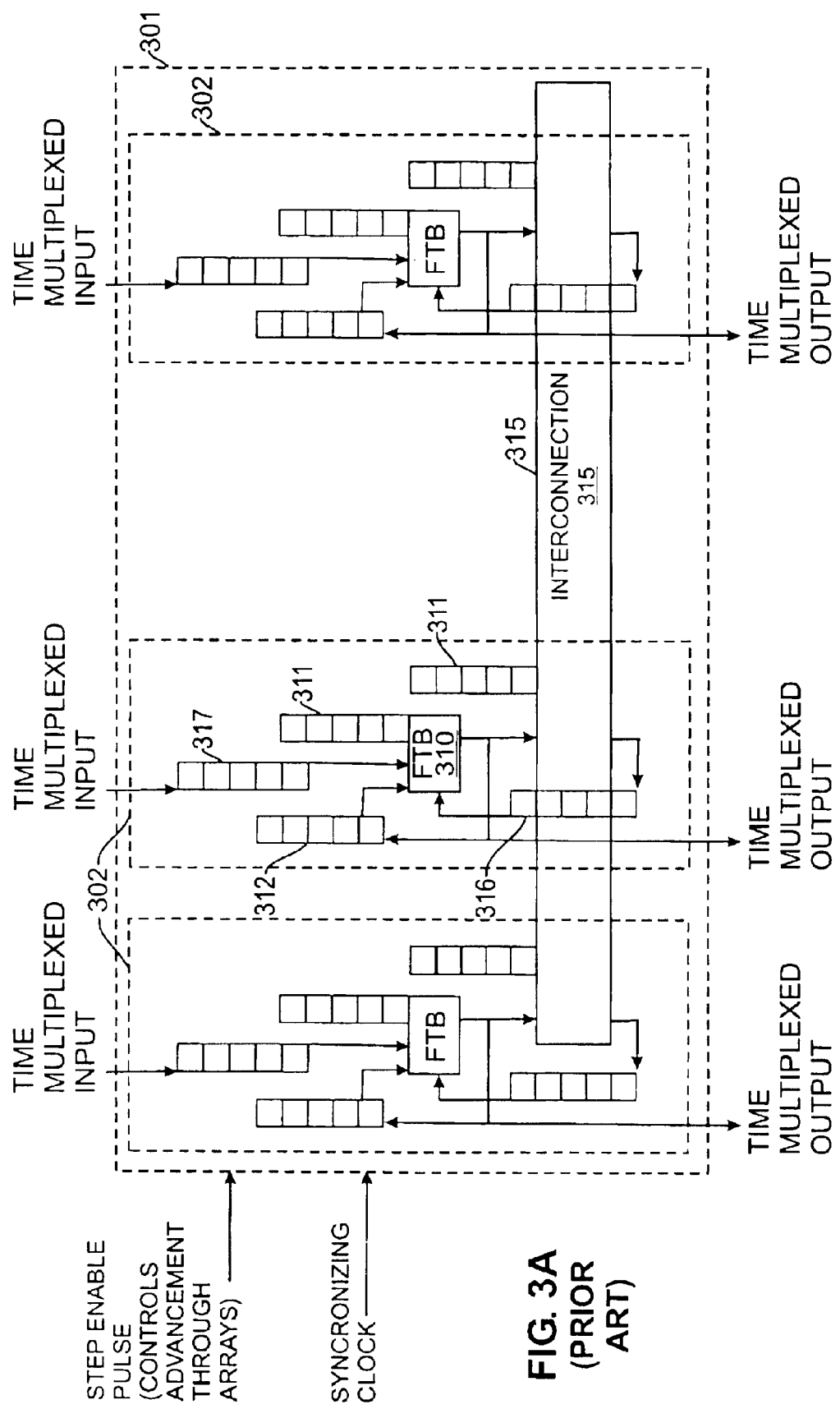
FIG. 3 is a high-level view of a prior art emulator chip module containing a time-multiplexed array of processors.
Figure 3B:
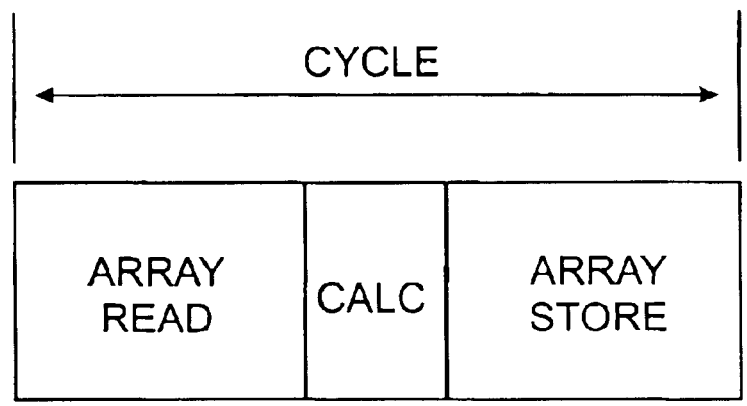

FIG. 3 is a high-level view of a prior art emulator chip module containing a time-multiplexed array of processors. As shown in FIG. 3, a module chip 301 contains a plurality of cells 302, the number of cells being designated P. Each cell 302 is effectively a small processor, which performs a different logic function for different inputs during each respective time slice (i.e., cycle of a system-wide synchronizing clock). The cell contains function table logic 310, which emulates a simple logic function based on a data value. The data represents a truth table for the number of inputs, so that the number of data bits equals the number of combinations of inputs, i.e., equals 2 to the power of the number of inputs. E.g., a truth table for 3 inputs may assume any of eight different combinations, and therefore 8 bits are required to specify any arbitrary value for the truth table. Because function table logic 310 performs a different logic function in each time slice, the truth table data is contained in a control array 311 having a number of entries equal to the number of time slices supported, this number being designated S. Control array 311 further specifies input sources and other matters. The values in control array 311 are cycled through table function logic 310, a different value being used in each time slice. The output of table function logic 310 is accumulated in data stack 312, which similarly contains S separate entries, one for each time slice. The output of table function logic 310 is further input to interconnection logic 315. Interconnection logic 315 permits the output of the function table logic 310 in any arbitrary cell to be routed to any other arbitrary cell within chip module 301. The output of interconnection logic is stored in input stack 316, which similarly contains S separate entries, one for each time slice. The routing of interconnection logic changes with each time slice, and is determined by a part of the control array 311. Off-chip inputs are further accumulated in an external input stack 317, also containing S separate entries, one for each time slice. Any of the external input stack 317, data stack 312 or input stack 316 may provide input to the function table logic 310. A prior art time-multiplexed array is described in further detail in U.S. Pat. No. 5,551,013 to Beausoleil et al., herein incorporated by reference.

As represented at the bottom of FIG. 3, a typical cycle (not necessarily to scale) in the prior art multiplexed system requires a time to read the control array and arrays used for data input, a time to calculate the value, and a time to store the value in the various stacks. The bulk of the time required for a cycle is consumed in reading and storing, with a relatively small amount of time consumed in the calculation phase.

Figure 4B:
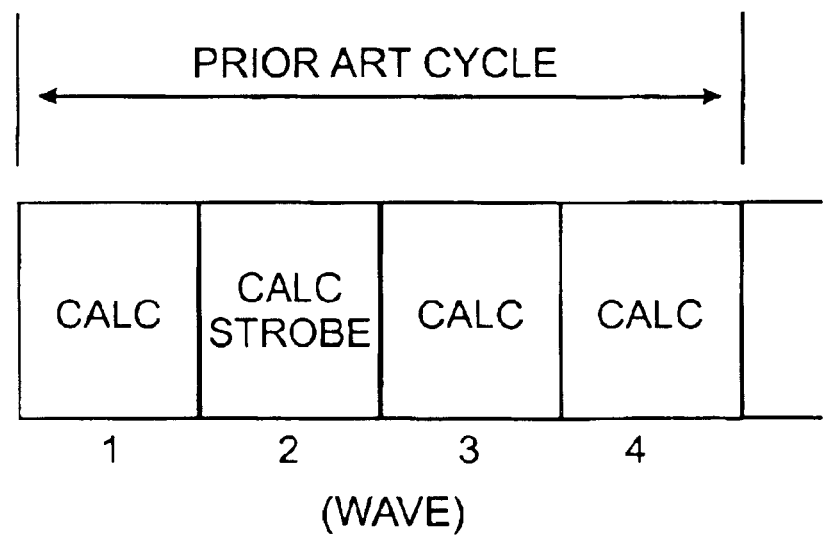
FIG. 4 is a high level view of an equivalent function emulator chip module in accordance with the preferred embodiment.
Figure 4A:
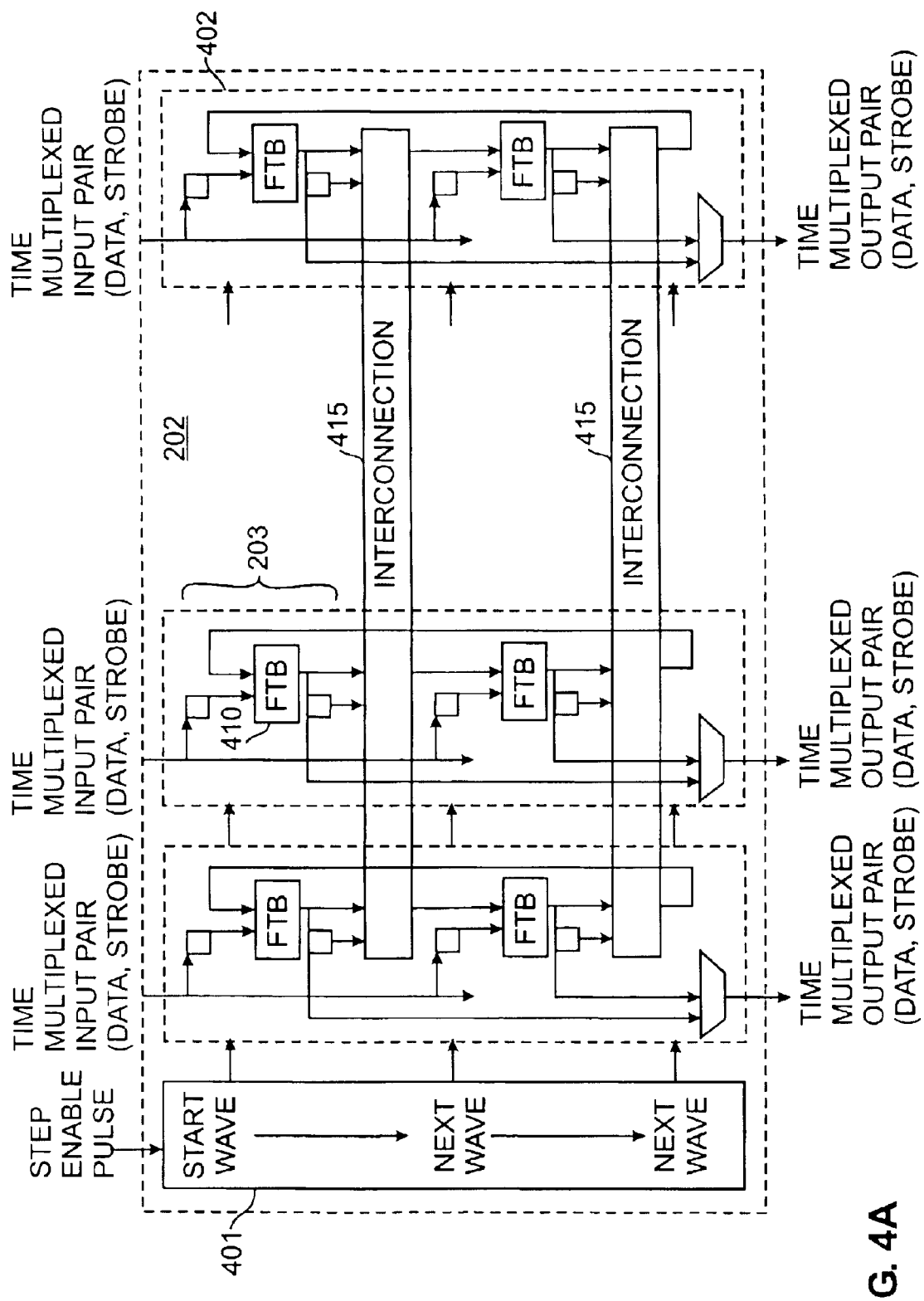

FIG. 4 is a high level view of an emulator chip module in accordance with the preferred embodiment of the present invention, having function equivalent to that of the time multiplexed chip of FIG. 3. The chip module 202 contains an array of cells 203, which are conceptually arranged in rows and columns. The row and column arrangement is only a conceptual way of understanding the chip function, and the physical arrangement on a chip does not necessarily correspond to row and columns as described herein. To provide function equivalent to the module of FIG. 3, a total of S×P cells are required in S rows and P columns. Each column of cells 402 corresponds roughly in function to a single cell 302 of the prior art multiplexed array. Each column contains S cells, the number of cells corresponding to the number of time slices supported by the time multiplexed processor array, i.e., the number of entries in the control array, input stack, etc. of the time multiplexed processor array.

Although the number of cells is greatly increased over the prior art time multiplexed array, each individual cell of the module of FIG. 4 is much simpler. Specifically, control arrays and stacks for various data are not needed. Because each cell 203 performs only one logic function, this function is stored in a configurable register in the function table logic 410. Function table inputs are similarly simplified.

As shown in FIG. 4, there is no synchronizing clock input to module 202. Each row of cells in module 202 can be viewed as performing the function of a time slice in the multiplexed array of FIG. 3. But progression through the rows in controlled by internal wave generating logic 401. Wave logic 401 generates separate wave signals for each row, indicating when the cells of that row may compute and latch values. The time period of wave signals may vary depending on the need for external I/O. Thus, each chip module runs asynchronously, as fast as its own required logic permits. Because there is no synchronizing clock, each I/O port comprises a data line and a strobe line, the strobe line being used to indicate when data is valid.

External (off-chip) I/O is shared on a column basis. I.e., a separate external input port and external output port exists for each column. Each cell in the column shares common external input ports, and shares common external output ports, the use of which is time-multiplexed according to the wave signal.

The simplicity of the individual cells and the use of an internal wave instead of a global synchronizing clock substantially increases the speed of emulation in the module of the preferred embodiment versus that of the prior art time-multiplexed processor array. This is represented conceptually in the bottom of FIG. 4 (representation not necessarily to scale). The cells do not need to perform a read function of input data and control arrays, and do not need to store values. Accordingly, most of the time is spent in the calculation phase. For this reason, it is possible to execute several waves in the system of the preferred embodiment in the time it requires the time-multiplexed system to execute a single synchronous cycle. As shown in FIG. 4, some waves (specifically, wave 2) may require more time than others. This occurs when extra wait is inserted in the wave time to accommodate external (off-chip) I/O.

The increase in number of cells over a time multiplexed array increases the complexity of interconnection logic 415. Preferably, it is possible to connect the output of any arbitrary cell to the input of any arbitrary cell within a module for functional equivalence with the time-multiplexed design (off-module connections are more limited). There are two possible approaches, explained further herein. One involves time-multiplexing the interconnection logic, so that each cell in a column receives input from a common set of interconnects, the interconnects being time-multiplexed. Another alternative involves providing a massive array of configurable interconnects to all the cells.

A large array of configurable interconnects is likely to be faster than time-multiplexed interconnection logic, but the number of components required is very large. Despite the simplicity of individual cells, it may be difficult to fit all the required connection logic on a module. Time-multiplexing the interconnection logic reduces the number of interconnection components needed.

While it may be thought that time-multiplexing the interconnection logic will make the module run near the speed of the prior art time-multiplexed processor array, this is not necessarily so. Unlike data paths in the time-multiplexed processor, which require read from and store to various arrays, the interconnection logic configuration data is read-only, and it is read in a completely sequential, predictable manner. Thus while it can be stored in an array or table of registers when the module is initially configured by support system 102, during emulation execution the data can be accessed in a pipelined, look-ahead fashion, so it should be possible to maintain a high asynchronous data flow.

Figure 5:
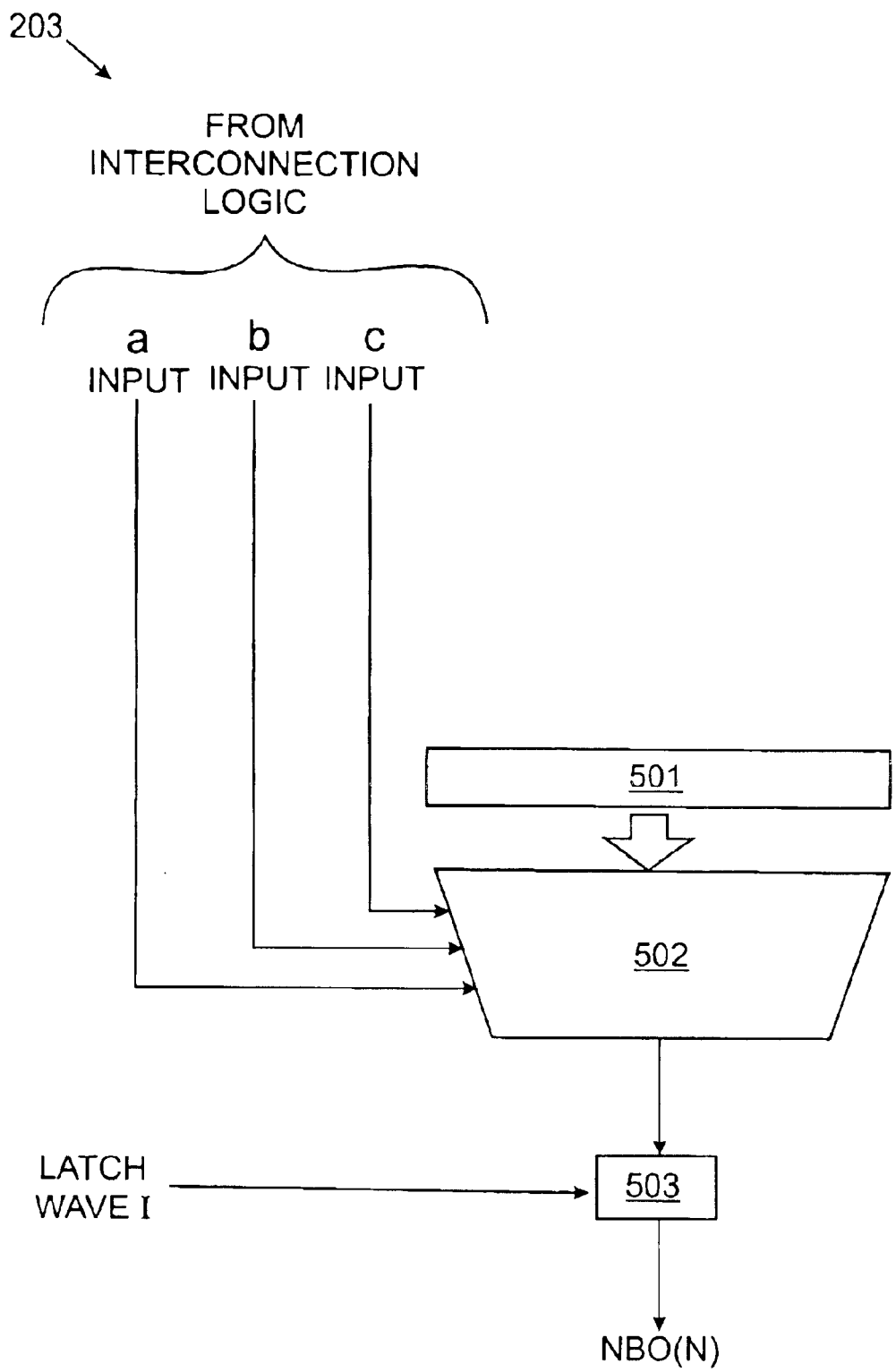
FIG. 5 shows in greater detail the major components of a typical individual cell within a chip module, according to the preferred embodiment.

FIG. 5 shows in greater detail the major components of a typical individual cell 203. The cell is designated cell N, being in row I and column J. Cell 203 comprises a configurable 8-bit function register 501, a function multiplexer 502, and an output latch 503. Function register 501 holds a truth table value for three cell inputs, designated a, b and c. The inputs a, b and c operate function multiplexer 502 to select one of the eight bits from register 501 as the output of multiplexer 502.

Any arbitrary truth table value can be placed in register 501, to emulate any arbitrary logic function of three inputs. Register 501 is loaded with a value from support system 102 during configuration. Since performance during configuration is not particularly critical, register 501, as well as all other configurable memory elements, can be loaded using a minimal amount of hardware, e.g., by sequentially clocking in the bit values. The necessary configuration hardware is not shown.

The output of multiplexer 502 is latched in output latch 503 on receiving a latch signal for wave I. Once latched, the value remains in output latch 503 until wave I is again reached on the next pass through the emulator (i.e., the next emulated cycle of the device being emulated). The output of latch 503 is considered the output of cell N, and is designated NBO(N). This output is sent to the interconnection logic and to the external output logic, described more fully herein.

Figure 6:
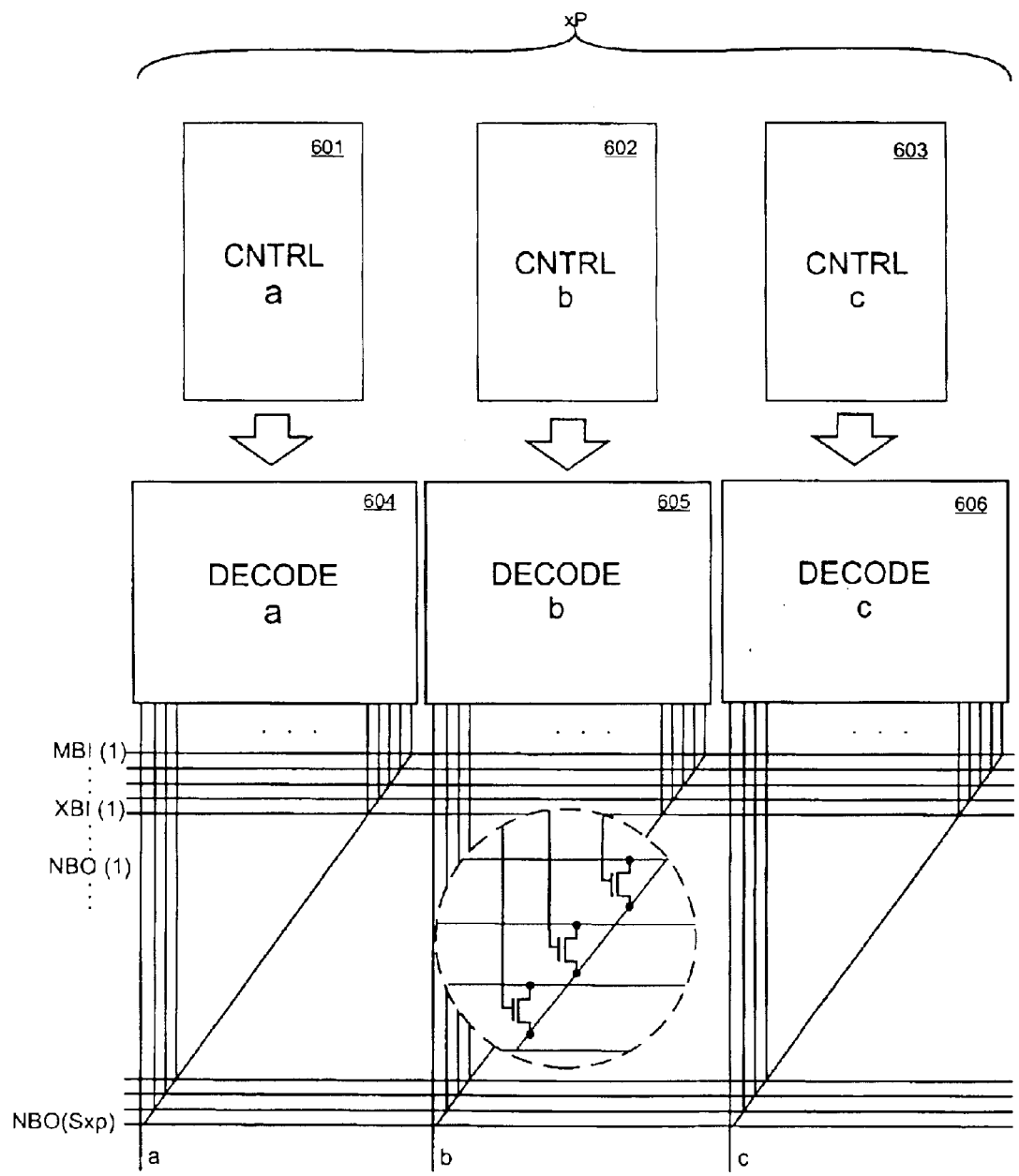
FIG. 6 shows in greater detail a portion of the interconnection logic, according to a first variation of the preferred embodiment in which the interconnection logic is time-multiplexed.

FIG. 6 shows in greater detail a portion of the interconnection logic, according to a first variation of the preferred embodiment. In this variation, the interconnection logic is time multiplexed. For each column 402 of cells, there is a set of three interconnection control arrays 601–603, a different one corresponding to each of the inputs a, b and c. Control arrays 601–603 each contain S entries, each entry corresponding to a different row of cells (i.e., for use in a different wave). Each entry contains $\log_2(SP+2S)$ bits (rounded up to the nearest integer), and is thus sufficient to specify, as the source for the input line, either (i) any arbitrary cell out of all the cells in module 202 (total of SP cells); (ii) any of the S MBI inputs saved in latches in the MBI port logic for column J; or (iii) any of the S XBI inputs saved in latches in the XBI port logic for column J. The input lines are shown running horizontally across the bottom of FIG. 6. In any given wave I, the entry corresponding to wave I is read from control array 601 into decode logic 604. Decode logic 604 contains (SP +2S) output lines, only one of which will be activated (logic '1') in wave I as specified in the corresponding entry in control array 601. Activating a line switches on a pass transistor connecting input line a to one of (i) the corresponding NBO line from the source cell, (ii) the corresponding MBI line from the MBI input port, or (iii) the corresponding XBI line from the XBI input port. Control arrays 601–603 are configurable in the same manner as other configurable elements in module 202, such as function registers 501, although the hardware required to configure the arrays is not shown. The logic shown in FIG. 6 is replicated P times, once for each column 402.

Figure 7:
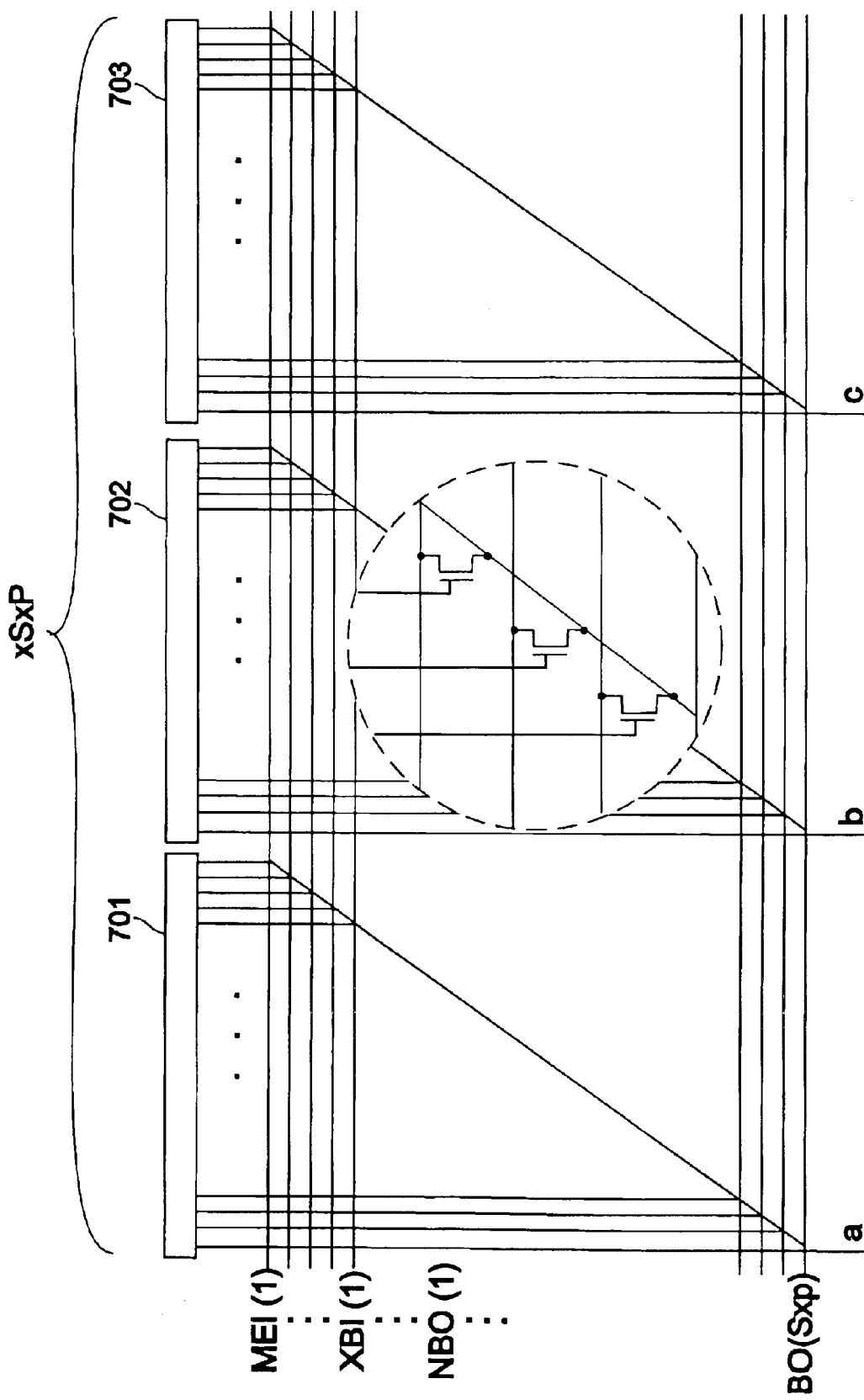
FIG. 7 shows in greater detail a portion of the interconnection logic, according to a second variation of the preferred embodiment in which separate interconnection logic exists for each cell input.

FIG. 7 shows in greater detail a portion of the interconnection logic, according to a second variation of the preferred embodiment. In this variation, separate interconnection logic exists for the input of each cell, and thus the logic shown in FIG. 7 is replicated (S×P) times. Control arrays 601–603 and decode logic 604–606 are replaced by a single array of memory bits 701–703, one bit corresponding to each output line (meaning that (SP+2S) memory bits are needed in each array 701, 702 and 703). Each memory bit controls a single gate of a pass transistor, which connects a cell input line (a, b or c) to one of either (i) an NBO line from a source cell, (ii) an MBI line from the MBI input port; or (iii) an XBI line from the XBI input port. Arrays 701–703 are configurable in the same manner as other configurable elements in module 202, such as function registers 501, although the hardware required to configure them is not shown.

FIGS. 6 and 7 are intended as logical representations of the interconnection matrix, and are not intended to imply any particular layout geometry. E.g., it may be desirable to physically place portions of decode logic 604–606 or memory bits 701–703 within the matrix of interconnection wires, and specifically, nearer to the pass transistors, in order to reduce path lengths, etc.

For the interconnection logic of FIG. 6, it will be observed that control array 601 stores $(S \times \log_2(SP+2S))$ bits, and there are 3P such arrays on module 202, storing a total of $(3SP \times \log_2(SP+2S))$ bits. Decode logic 604 produces (SP+2S) outputs to the pass gates of the interconnection array, requiring (SP+2S) pass transistors, which must also be multiplied by 3P, for a total of $3SP^2+6SP$ pass transistors. The decode logic itself will require on the order of two or more transistors per output line, for a total of $6SP2$ or more. Since the number of transistors required for the decode logic and the interconnects is likely to be considerably larger than the number of bits in the interconnection arrays 601–603, it is reasonable to use relatively high speed storage, such as register logic, even at the cost of additional hardware. This is particularly so when one compares the logic of FIG. 6 with that of FIG. 7. FIG. 7 requires (SP+2S) pass transistors for each input line, but since the logic must be replicated for each cell, a total of $3S^2P^2+6S^2P$ pass transistors are required for the interconnects. Furthermore, there must be one memory bit in an array 701–703 for each pass transistor, making a total of $3S^2P^2+6S^{2'}$ memory bits. At a minimum, each memory bit will require one transistor, although for a high speed implementation a static cell with multiple transistors is more desirable. Except for very small values of S and P, the total amount of hardware needed for the implementation of FIG. 7 is much larger than that of FIG. 6, even if the memory bits of control arrays 601–603 are stored in recirculating latches.

In the preferred embodiment, a global step enable pulse is used to synchronize all the modules 202 in emulation engine 101 with the target system 103. Upon receipt of the step enable pulse in module 202, wave logic 401 signals the first wave. Wave logic 401 has built in delays for the time required to propagate signals through interconnection logic 415 and cells 203. Wave logic further has wait states in which it will wait, if necessary, for an off-chip input to be received or an off-chip output to be sent.

Figure 8:
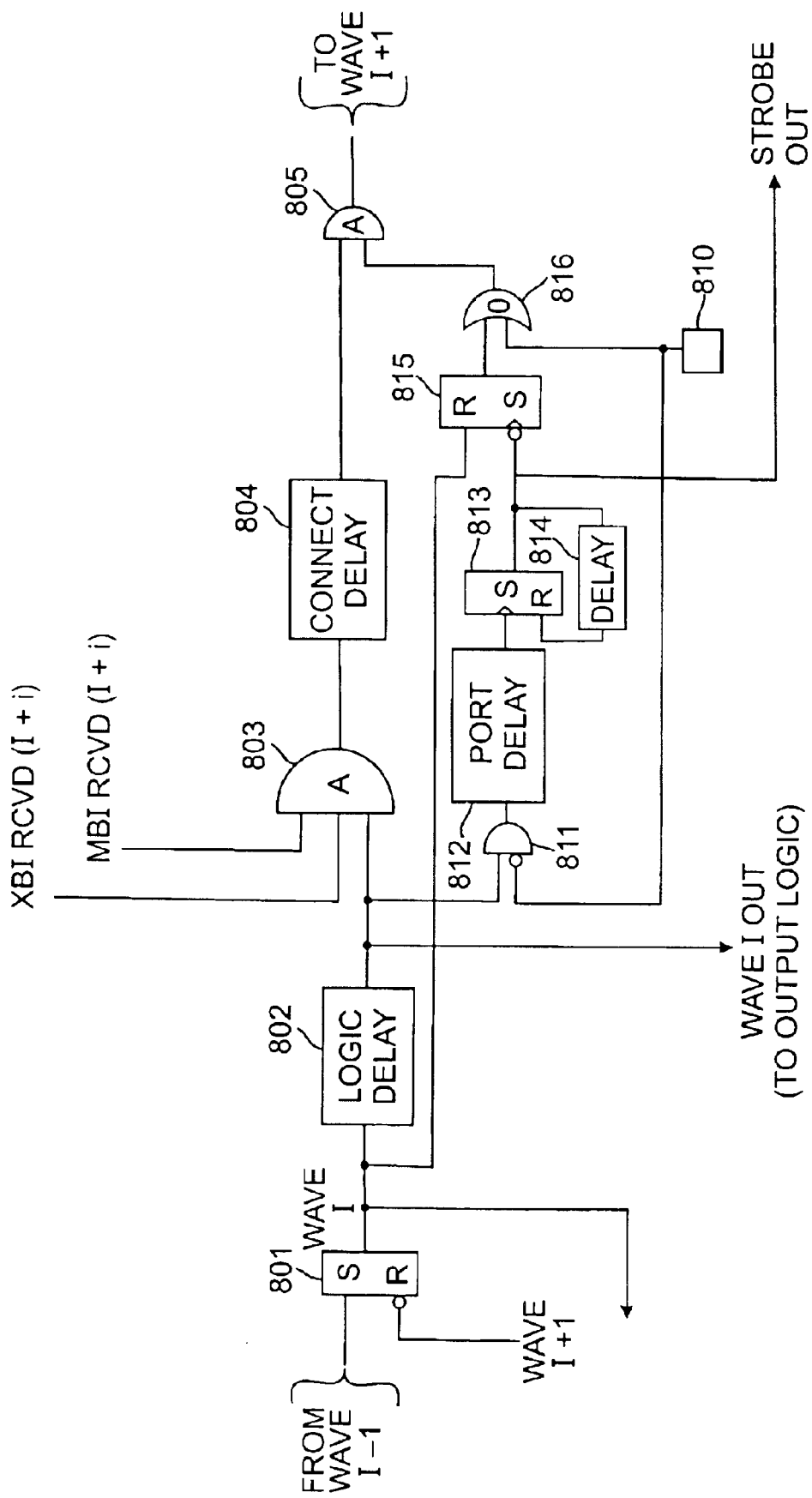
FIG. 8 illustrates the major components of a typical stage of wave logic, according to the preferred embodiment.

FIG. 8 illustrates the major components of a typical stage of wave logic 401, corresponding to a single wave I. As shown in FIG. 8, upon completion of wave (I−1), a signal arrives setting S–R latch 801. The output of latch 801 signifies the wave I state. This output is fed back to stage (I−1), to reset a corresponding latch in stage (I−1). When wave I is complete, a similar feedback signal from stage (I+1) will reset latch 801. The output of latch 801 passes through logic delay 802, which delays the signal propagation a sufficiently long period of time for cell inputs to propagate through function multiplexers 502 in each cell and become available to output latches 503. Depending on the implementation of output latches 503 (e.g., S–R, leading edge clocked, falling edge clocked), a suitable latch trigger signal (not shown) is tapped from an appropriate part of the logic shown in FIG. 8 to latch all the output latches 503 in wave I, i.e., in the Ith row of module 202.

The output of delay 802 also is input to AND gate 803, along with two input control signals. These input control signals indicate that any required external inputs have been received. One input control signal is for the XBI inputs to be used in wave (I+i), while the other control signal is for the MBI inputs to be used in wave (I+i), where i is some fixed delay (e.g., 1). Module 202 is capable of receiving P XBI inputs per wave and P MBI inputs per wave, although in typical operation there will be many waves for which no inputs are received. Since all modules run asynchronously, there must be some means of assuring that required inputs have been received before they are needed. The purpose of AND gate 803 is to force the wave logic to wait at wave I until the required external inputs have been received. If the XBI RCVD signal is high, it indicates that the required inputs, if any, have been received (and similarly for MBI RCVD), although in fact it is possible that no inputs were required to be received.

The output of gate 803 passes through connection delay logic 804 which introduces another delay in the signal propagation, this delay being sufficient to allow all output signals of the output latches 503 to propagate through interconnection logic to the cell inputs. Where a time multiplexed interconnection logic as shown in FIG. 6 is used, this delay may be longer than for a full connection scheme as shown in FIG. 7. I.e, the delay must account for time required to change the control entry in each control array 601–603 and propagate this signal through the decode logic 604–606. The output of connection delay 804 is input to AND gate 805, which will wait for any required off-chip output to be sent before propagating the wave signal to the next stage of wave logic 401.

If no external output is required to be sent during wave I, the bit in 1-bit register 810 is set to logic '1', which makes the output of OR gate 816 a logic 'I', disables components 812–815, and allows the wave signal to pass through AND gate 805 as soon as it passes through connection delay logic 804. If an external output is required, the wave signal output from logic delay 802 passes through AND gate 811 and port delay 812, which introduces an additional delay sufficient for the output port drivers to receive an output signal from a cell 203 and impose it on the appropriate output line. After passing through port delay, the signal sets latch 813 for a time determined by delay 814. The output of latch 813 is the strobe pulse, which is sent to the output port for external transmission. Latch 815, which was reset upon entering stage I, is set upon completion of the strobe pulse, allowing AND gate 805 to propagate the wave signal. A separate strobe signal is generated for each wave stage. The Wave I Out signal, from the output of logic delay 802, is used by the output port logic to select an output.

Figure 9:
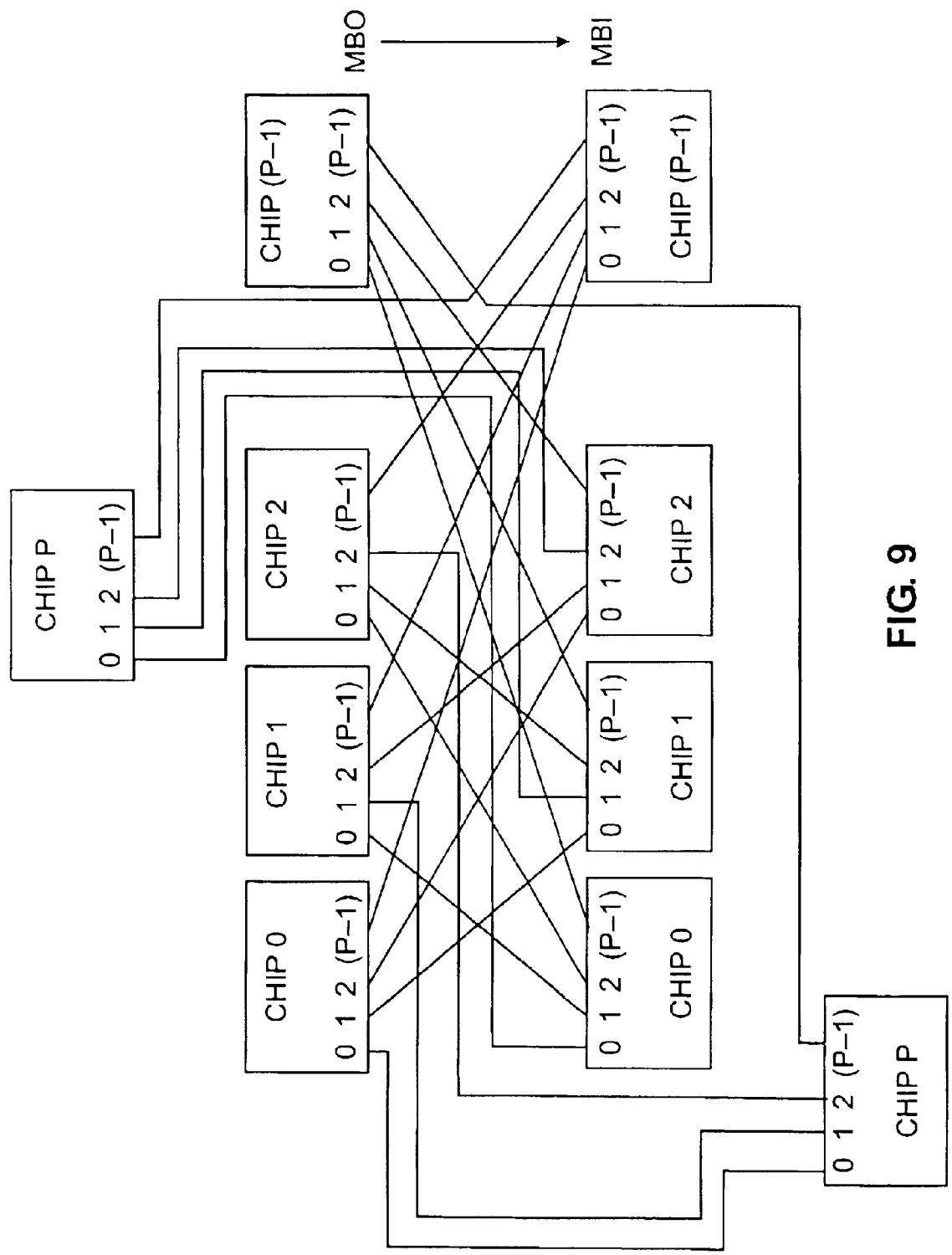
FIG. 9 represents the mapping of intermeddle I/O within an emulation board of an emulation engine, according to the preferred embodiment.

FIG. 9 represents the mapping of MBI and MBO I/O within an emulation board 201 of emulation engine 101. Preferably, each emulation board contains P+1 modules 202. Each module has P MBI input ports (each having a data line and a strobe line), and P MBO output ports (each having a data line and a strobe line). The MBI and MBO ports are used for communicating with other chip modules on the same emulation board 201. For communications with different boards, XBI and XBO are used similarly to MBI and MBO, although there is not necessarily a one-to-one mapping of available ports and boards.

As shown in FIG. 9, MBO output port #1 of chip 0 is mapped to MBI input port #0 of chip 1, MBO output port #2 of chip 0 is mapped to MBI input port #0 of chip 2, etc., and MBO output port #(P−1) of chip 0 is mapped to MBI input port #0 of chip (P−1). Since the output port corresponding to its own chip number (e.g., output port J of chip J) would otherwise be unused, all such ports are mapped to chip P, making it possible to fully interconnect P+1 chip modules 202 on board 201.

It will be observed that if chip 2 wishes to send data to chip 9, the data must be first placed in chip 2's MBO output port 9, which means that it must come from a cell in column 9 of chip 2. If the signal is generated in a different cell, it must first be routed to a cell in column 9 so that it can be placed on output port 9. The same holds true of the received signal in chip 9. The signal will be received at port 2, and can only be input to a cell in column 2, although from there it can be re-routed to any cell in the module.

Figure 10:
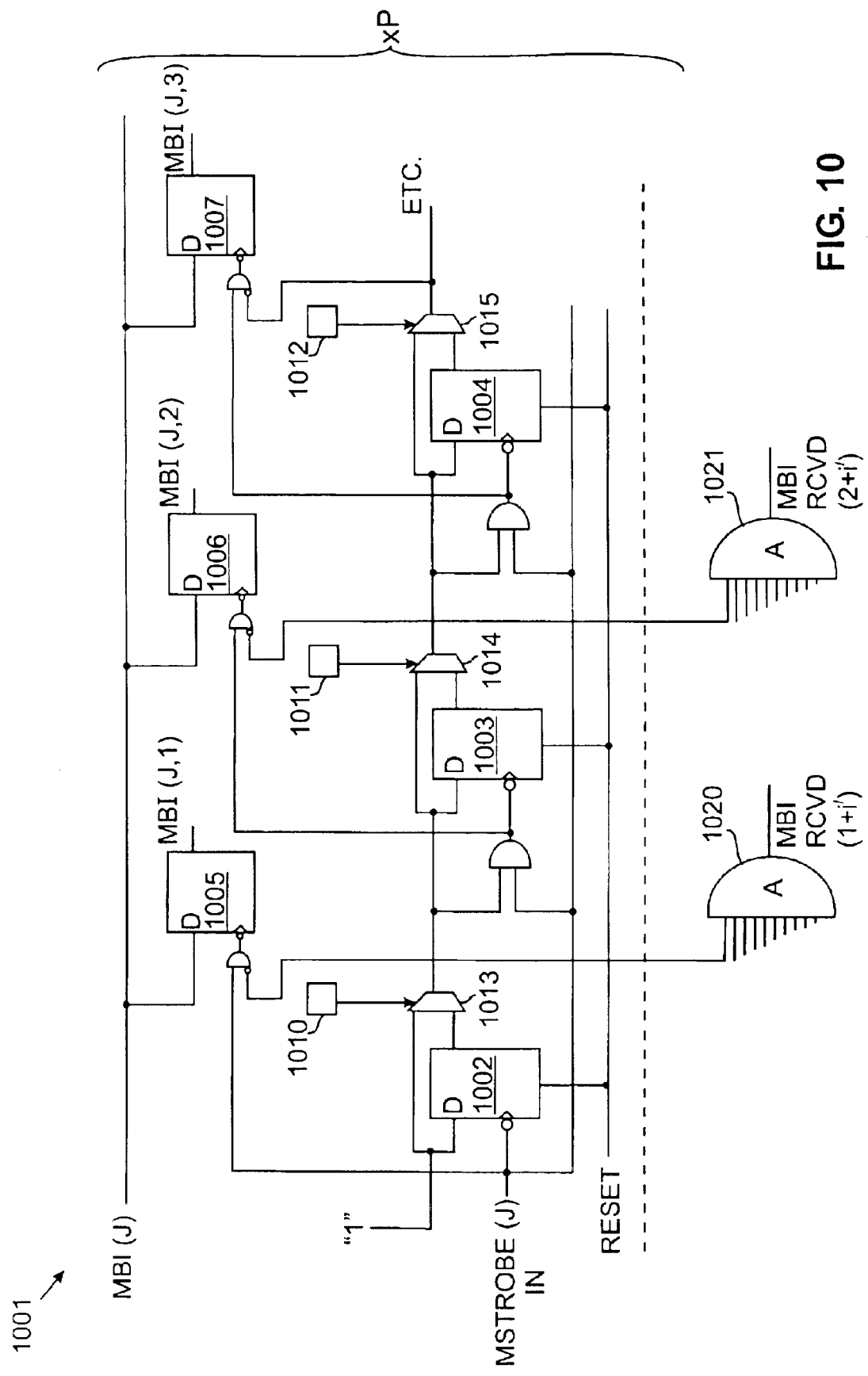
FIG. 10 illustrates a portion of a typical input port logic, according to the preferred embodiment.

FIG. 10 illustrates a portion of a typical MBI input port 1001. Preferably, there is one such MBI input port for each column of cells in module 202, a total of P MBI input ports. There are also a total of P XBI input ports, which are similar in construction. Input port 1001 comprises a series of D latches (stage latches) 1002–1004 for recording the stage of progress, and a series of D latches (data latches) 1005–1007 for recording data received. I.e., each stage latch is associated with a data latch, there being one such pair for each row of cells in module 202, a total of S stage latches and S data latches, only three of which are shown in FIG. 10.

For each stage latch, there is also a configurable use memory bit 1010–1012, which controls a corresponding 2-bit input multiplexer 1013–1015. The use bit determines whether an input is expected for the corresponding stage. A current state propagates through the stage latches, either as strobes are received or, if no input is expected for a particular stage, immediately. I.e., if no input is expected, the stage latch is by-passed as soon as the signal from the previous stage is received. If an input is expected, the stage latch waits for the next strobe after the previous stage signal is received. A data signal received on line MBI(J) is latched into the data latch 1005–1007 corresponding to the furthest extent of propagation of the current state.

The output of each stage is also input to AND gates 1020, 1021, which perform a logical AND of the stage signal for a given stage from each of the MBI input ports 1001, i.e., each AND gate 1020, 1021 has P inputs, one for each MBI input port. The output is sent to wave logic 401, where it is used to delay wave propagation if necessary until a required input is received, as described previously.

Connections to the output ports may be implemented either using a scheme analogous to the time-multiplexed interconnection scheme of FIG. 6, or to the full interconnection scheme of FIG. 7. Since the number of input and output lines is much lower than used for interconnection logic, it may be reasonable to use a full interconnection scheme for the output ports even though a time-multiplexed scheme is used for cell interconnections.

Figure 11:
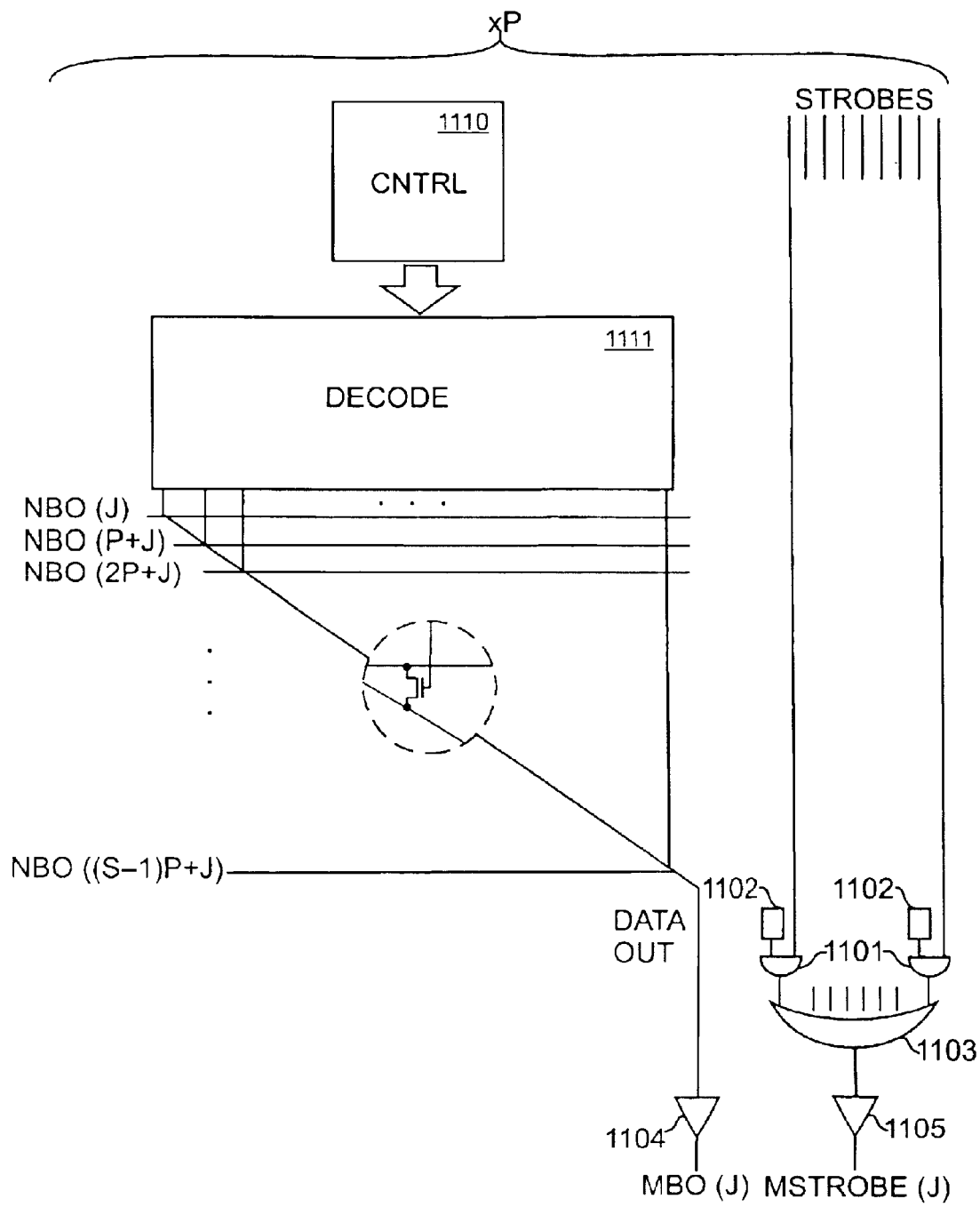
FIG. 11 illustrates a typical output port logic using time-multiplexed internal connections, according to one variation of the preferred embodiment.

FIG. 11 illustrates a typical output port logic for an MBO output port using a time-multiplexed approach for its internal connections, the XBO ports being similar. Preferably, there is one MBO port and one XBO port for each column of cells, a total of P MBO ports and P XBO ports. Only the cells in the corresponding column can provide input to the MBO and XBO ports. As with input, the external output is time-multiplexed. As shown in FIG. 11, a set of S output lines (NBO), one from the output latch 503 of each cell in column J is connected to common data output line by respective pass transistors. The gates of the pass transistors are controlled by respective control lines from decode logic 1111. Decode logic 1111 decodes entries in output port control array 1110. Array 110 contains S entries, one corresponding to each wave, each entry containing $\log_2 S$ bits. Each entry in array 1110 specifies a single NBO line as the source for output during the corresponding wave. Logic (not shown) cycles through the entries in array 1110 in response to successive wave signals generated by wave logic 401, which causes one of the outputs of decode logic 1111 to be active in each respective wave. The active line enables the gate of its pass transistor to transmit the corresponding NBO to the data out line.

A set of S strobe lines generated by wave logic 401, one for each wave stage, is connected to respective AND gates 1101. Each AND gate 1101 receives a strobe and a configurable 1-bit enable memory 1102 as input. Each enable bit 1102 is used to specify whether the strobe is enabled for a particular port J at a particular wave I. If the enable bit is on, the strobe passes through AND gate 1101 to OR gate 1103, which ORes the outputs of all AND gates 1101. Output drivers 1104, 1105 then drive the signal off the chip module. Output drivers 1104, 1105 are preferably implemented as differential driver pairs to minimize noise.

Figure 12:
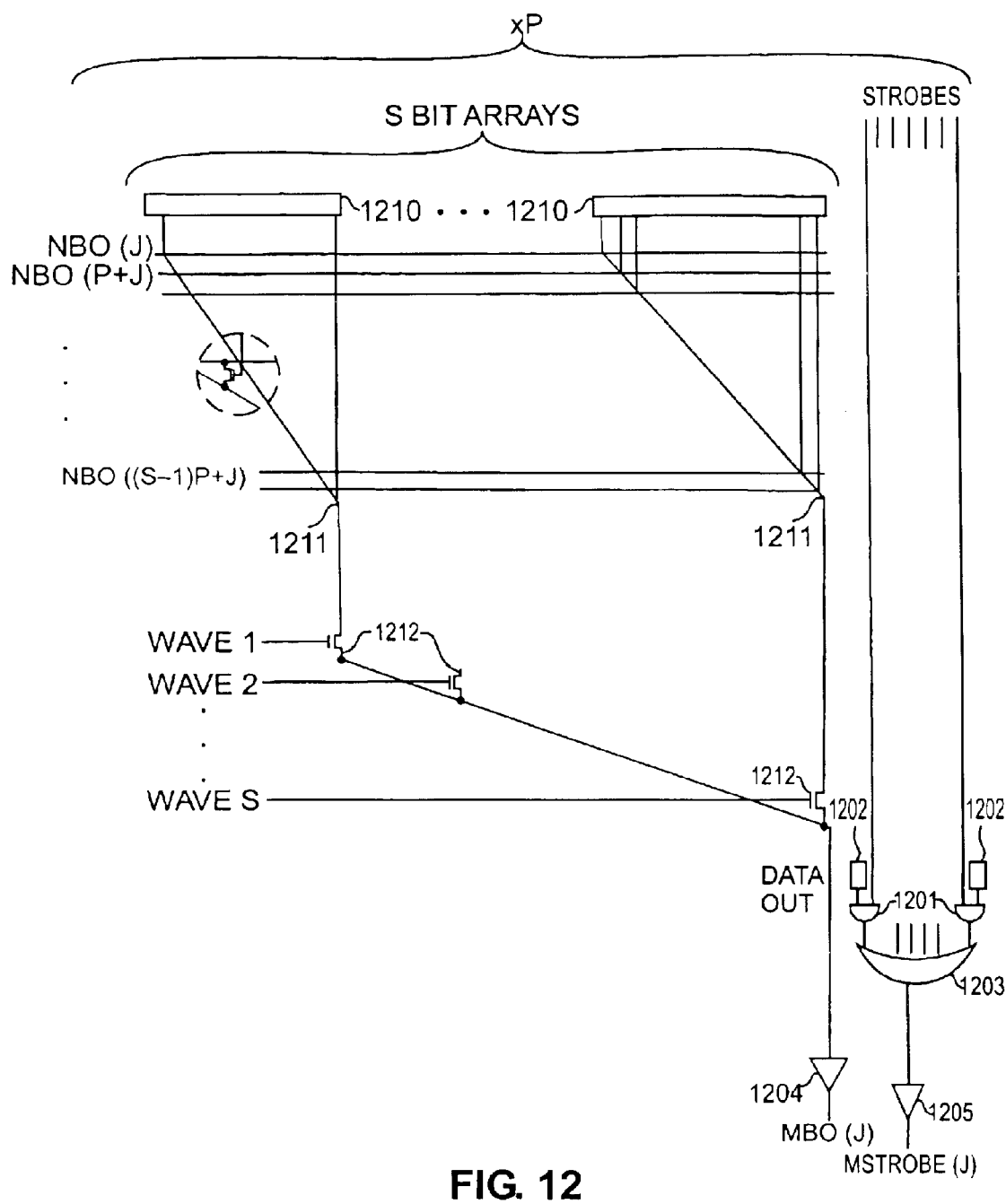
FIG. 12 illustrates a typical output port using full internal interconnections, according to another variation of the preferred embodiment.

FIG. 12 illustrates a typical output port logic for an MBO output port using an alternate full interconnection approach for its internal connections, the XBO ports being similar. As with the output ports of FIG. 11, there is one MBO port and one XBO port for each column of cells, and only the cells in the corresponding column can provide input to the MBO and XBO ports. As with input, the external output MBO(J) is time-multiplexed. As shown in FIG. 12, a set of S output lines (NBO), one from the output latch 503 of each cell in column J is connected to a set of S output line 1211 by respective pass transistors. A control bit array 1210 is associated with each output line 1211, there being S arrays 1210, each array containing S bits. Each array is associated with a different wave. The control arrays 1210 control the gates of pass transistors which connect the input lines with output lines 1211. The output lines are further gated by pass transistors 1212 controlled by the wave signals generated by wave logic 401, so that only one output line 1211 is active in any one wave. The active output line imposes its output on the common data out line.

The strobe and output driver section of the output port is identical to that of FIG. 11, components 1201–1205 corresponding to components 1101–1105. While the strobes are shown in FIGS. 11 and 12 as controlled by a AND gates 1101, 1201 and OR gates 1103, 1203, these could actually be implemented as pass transistors controlled by enable bits 1102, 1202 similar to the pass transistor arrays of various figures.

Due to various timing constraints and other matters, it may be difficult or impossible to utilize all cells in a single pass of S waves through the wave logic of the various chip modules. In this case, it may be desirable to implement an emulation system having more than S wave stages, e.g., 2S, 3S or more, thereby utilizing cells in a subsequent pass which were not previously utilized. I.e., the emulation system may be operated so that 2S, 3S or some other multiple of S waves corresponds to a single cycle of the target system being emulated. It is possible to do this with the chip modules described above, using special registers and counters on the emulation board to keep track of state which continue to hold or regenerate the step enable pulse for intermediate passes when the chip modules are ready to repeat a pass. Alternatively, the chip modules themselves could have on-board support hardware, particularly, a counter which keeps track of the number of passes through the wave logic and stops the chip module when all passes are complete, to await the next global step enable pulse.

In the preferred embodiments, each function multiplexer 502 receives three inputs, designated a, b and c. However, this number is simply a matter of design choice, and could be varied. Additionally, as described herein, there are a certain number of I/O ports, designated XBO, MBO., XBI, and MBI, but consistent with the present invention the number and configuration of such ports may vary, and it is not essential that every cell within a module have access to an I/O port.

In the preferred embodiments described herein, many detailed circuit elements are shown, such as gates, latches, transistors, etc. It will be appreciated by those skilled in the art that there are many alternative ways of designing subsystems described herein. E.g., wave logic 401 could be implemented in a variety of forms, even as an internal high-frequency clock, still preserving the essential functional characteristics of a wave described herein. The same is true of port logic such as input port logic and output port logic.

Although a specific embodiment of the invention has been disclosed along with certain alternatives, it will be recognized by those skilled in the art that additional variations in form and detail may be made within the scope of the following claims:

What is claimed is:

1. A chip module for an emulation system, comprising:
   a plurality of cells logically arranged in S rows and P columns, each row corresponding to a wave, each cell comprising:
   (a) a plurality of input lines,
   (b) a configurable logic function memory element specifying a logic function of said plurality of input lines, and
   (c) a logic function element performing the logical function specified by said configurable logic function memory element on said plurality of input lines to produce an output;
   configurable interconnection logic, said configurable interconnection logic routing the output of any cell to an input of any other cell; and
   wave logic for producing a plurality of sequential wave signals, each wave signal corresponding to a row of cells and controlling the propagation of logic signals through the cells of the row.

2. The chip module of claim 1, wherein said configurable interconnection logic comprises a time-multiplexed array of interconnections controlled by an interconnection control memory, said interconnection control memory having a plurality of entries, one entry corresponding to each wave of said wave logic, wherein interconnection of each wave are specified by the corresponding entry in said interconnection control memory.

3. The chip module of claim 1, wherein said wave logic includes delay logic for delaying the generation of an Nth sequential wave signal if an output required to be transmitted to an external source before generation of said Nth sequential wave signal has not yet been transmitted.

4. The chip module of claim 1, wherein said wave logic includes delay logic for delaying the generation of an Nth sequential wave signal if an input required to be received from an external source before generation of said Nth sequential wave signal has not yet been received.

5. The chip module of claim 1, further comprising a set of P output ports for transmitting data external to said chip module, each output port of said set corresponding to a respective column of cells, wherein each output port of said set is shared by the cells in the respective corresponding column of cells on a time-multiplexed basis.

6. The chip module of claim 5, wherein each output port of said set of P output ports comprises a data line and a strobe line, said strobe line indicating when data is available on said data line.

7. The chip module of claim 1, further comprising a set of P input ports for receiving data from at least one source external to said chip module, each input port of said set corresponding to a respective column of cells, wherein each input port of said set is shared by the cells in the respective corresponding column of cells.

8. The chip module of claim 7, wherein each input port of said set of P input ports comprises a data line and a strobe line, said strobe line indicating when data is available on said data line.

9. An emulation engine, comprising:
    a plurality of interconnected emulation boards;
    a plurality of chip modules mounted on said emulation boards, each board containing multiple chip modules, each chip module containing:
    (a) a plurality of cells logically arranged in S rows and P columns, each row corresponding to a wave, each cell comprising:
        (i) a plurality of input lines,
        (ii) a configurable logic function memory element specifying a logic function of said plurality of input lines, and
        (iii) a logic function element performing the logical function specified by 11 said configurable logic function memory element on said plurality of input lines to produce an output;
    (b) configurable interconnection logic, said configurable interconnection logic routing the output of any cell to an input of any other cell; and
    (c) wave logic for producing a plurality of sequential wave signals, each wave signal corresponding to a row of cells and controlling the propagation of logic signals through the cells of the row.

10. The emulation engine of claim 9, wherein said configurable interconnection logic comprises a time-multiplexed array of interconnections controlled by an interconnection control memory, said interconnection control memory having a plurality of entries, one entry corresponding to each wave of said wave logic, wherein interconnection of each wave are specified by the corresponding entry in said interconnection control memory.

11. The emulation engine of claim 9, wherein said wave logic includes delay logic for delaying the generation of an Nth sequential wave signal if an output required to be transmitted to an external source before generation of said Nth sequential wave signal has not yet been transmitted.

12. The emulation engine of claim 9, wherein said wave logic includes delay logic for delaying the generation of an Nth sequential wave signal if an input required to be received from an external source before generation of said Nth sequential wave signal has not yet been received.

13. The emulation engine of claim 9, wherein each chip module further comprises:
    (iv) a set of P output ports for transmitting data external to said chip module, each output port of said set corresponding to a respective column of cells, and
    (v) a set of P input ports for receiving data from a source external to said chip module, each input port of said set corresponding to a respective column of cells,
    wherein each output port of said set is mapped to a single input port of said set in another chip module in a one-to-one correspondence.

14. The emulation engine of claim 13, wherein each output port of said set of P output ports and each input port of said set of P input ports comprises a data line and a strobe line, said strobe line indicating when data is available on said data line.

15. The chip module of claim 9, further comprising a set of P input ports for receiving data from at least one source external to said chip module, each input port of said set corresponding to a respective column of cells, wherein each input port of said set is shared by the cells in the respective corresponding column of cells.

16. The chip module of claim 15, wherein each input port of said set of P input ports comprises a data line and a strobe line, said strobe line indicating when data is available on said data line.

* * * * *